United States Patent
Hu et al.

(10) Patent No.: US 6,787,880 B2
(45) Date of Patent: Sep. 7, 2004

(54) ESD PARASITIC BIPOLAR TRANSISTORS WITH HIGH RESISTIVITY REGIONS IN THE COLLECTOR

(75) Inventors: David Hu, Singapore (SG); Jun Cai, Singapore (SG)

(73) Assignee: Nano Silicon Pte. Ltd., Singapore (SG)

( * ) Notice: Subject to any disclaimer, the term of this patent is extended or adjusted under 35 U.S.C. 154(b) by 0 days.

(21) Appl. No.: 10/437,093

(22) Filed: May 13, 2003

(65) Prior Publication Data

US 2003/0201498 A1 Oct. 30, 2003

Related U.S. Application Data

(62) Division of application No. 09/999,230, filed on Dec. 3, 2001, now Pat. No. 6,589,833.

(51) Int. Cl.[7] ................... H01L 21/8238; H01L 27/102

(52) U.S. Cl. ................... 257/576; 438/208; 438/355

(58) Field of Search ..................... 257/350–360, 257/487–498, 576; 438/196, 208, 218–228, 282, 353–356

(56) References Cited

U.S. PATENT DOCUMENTS

| | | | |
|---|---|---|---|
| 5,043,782 A | 8/1991 | Avery | 357/23.13 |
| 5,519,242 A | 5/1996 | Avery | 257/356 |
| 5,559,352 A | 9/1996 | Hsue et al. | 257/328 |
| 5,689,133 A | 11/1997 | Li et al. | 257/361 |
| 5,898,205 A | 4/1999 | Lee | 257/355 |
| 5,969,923 A | 10/1999 | Avery | 361/56 |

OTHER PUBLICATIONS

Amerasekera et al., "Correlating Drain Junction Scaling, Salicide Thickness, and Lateral NPN Behavior, with the ESD/EOS Performance of a 0.25 $\mu$m CMOS Process," 1996 IEEE, IEDM 96–893 to 96–896.

Charvaka Duvvury, "ESD: Design for IC Chip Quality and Reliability," 2000 IEEE, pp. 251–259.

Polgreen et al., "Improving the ESD Failure Threshold of Silicided n–MOS Output Transistors by Ensuring Uniform Current Flow," IEEE Trans. on Electron Devices, vol. 39, No. 2, Feb. 1992, pp. 379–388.

Notermans et al., "The Effect of Silicide on ESD Performance," IEEE 1999, 37th Annual Int'l Reliability Physics Syop., San Diego, CA, pp. 154–158.

Chen et al., "Design Methodology and Optimization of Gate–Driven NMOS ESD Protection Circuits in Submicron CMOS Processes," IEEE Trans. on Electron Devices, vol. 45, No. 12, Dec. 1998, pp. 2448–2456.

*Primary Examiner*—Matthew Smith
*Assistant Examiner*—Calvin Lee
(74) *Attorney, Agent, or Firm*—George O. Saile; Stephen B. Ackerman; William J. Stoffel

(57) ABSTRACT

A method and a structure for a parasitic bipolar silicided ESD device that has high resistivity regions within the collector of the parasitic NPN. The device has the structure of a N-MOS transistor and a substrate contact. The device preferably has silicide regions over the doped regions. The invention has two types of high resistivity regions: 1) isolation regions (e.g., oxide shallow trench isolation (STI)) and 2) undoped or lightly doped regions (e.g., channel regions). The channel regions can have gates thereover and the gates can be charged. Also, optionally a n⁻well (n minus well) can be formed under the collector. The high resistivity regions increase the collector resistivity thereby improving the performance of the parasitic bipolar ESD device.

28 Claims, 6 Drawing Sheets

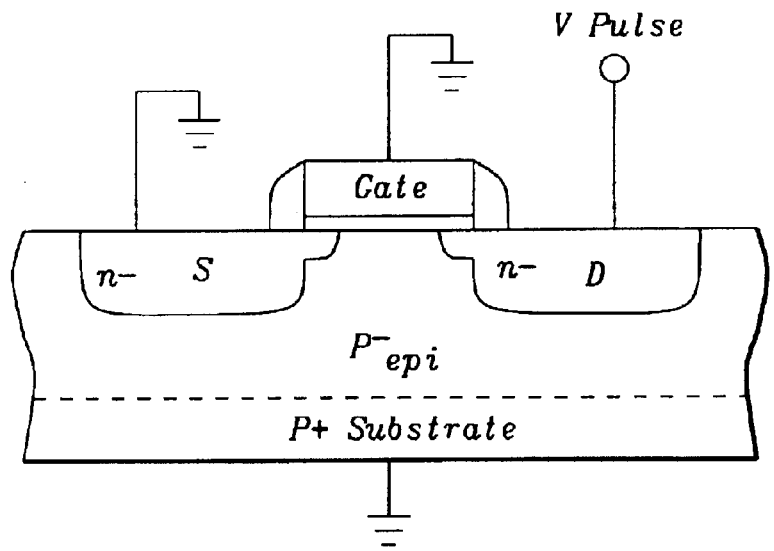
*FIG. 5A — Prior Art*
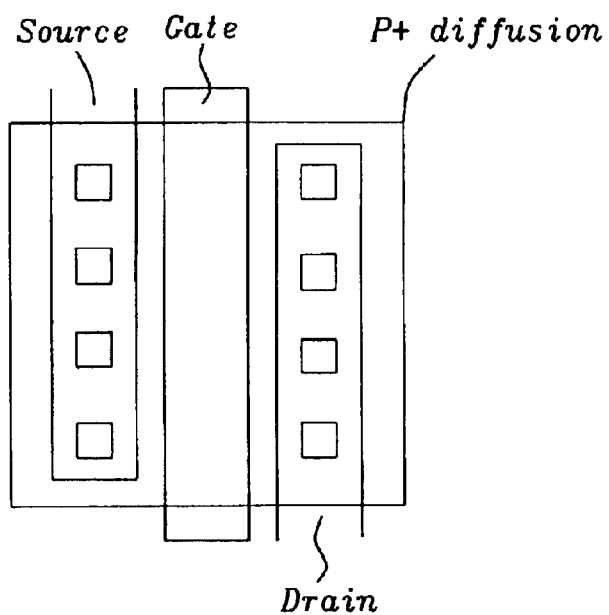
*FIG. 5B — Prior Art*

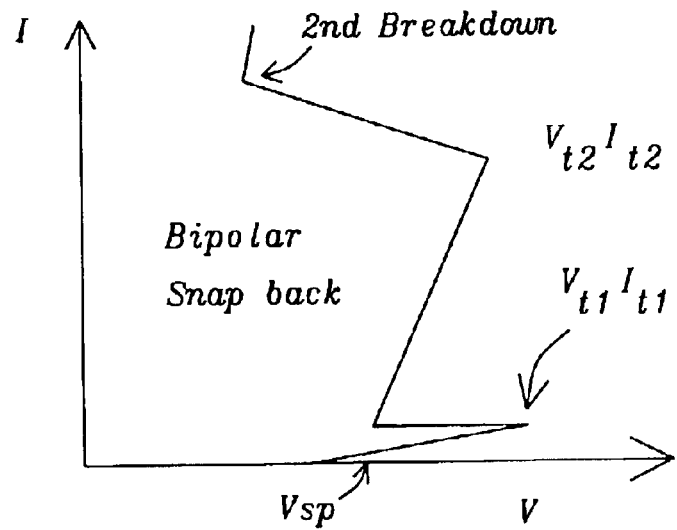
*FIG. 5C – Prior Art*
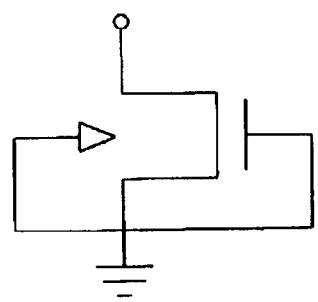
*FIG. 5D – Prior Art*

ESD PARASITIC BIPOLAR TRANSISTORS WITH HIGH RESISTIVITY REGIONS IN THE COLLECTOR

This is a division of patent application Ser. No. 09/999,230, filed Dec. 3, 2001 and issued as U.S. Pat. 6,589,833, Esd Parasitic Bipolar Transistor With High Resistivity Regions In The Collector, assigned to the same assignee as the present invention.

BACKGROUND OF INVENTION

1) Field of the Invention

This invention relates generally to fabrication of semiconductor devices and more particularly to the fabrication of an Electro Static Discharge (ESD) device and more particularly an Electro Static Discharge (ESD) device using a silicide process.

2) Description of the Prior Art

The n-type MOS transistor has been widely employed as the primary component for an ESD protection circuit in semiconductor IC devices. It is well known that silicidation of the drain and LDD junctions reduce ESD performance significantly. Most salicided process have a removal option which allows unsalicided areas (e.g., resistors) to be formed.

NMOS transistors stacked in a cascade configuration provide robust ESD protection for mixed voltage I/O in both silicided and silicide-blocked technologies. However, this kind of device has high snapback voltage. Also, the high snapback voltage of the stacked NMOS degrades its IT2 (IT2 is the second breakdown trigger current)) since the power dissipation is great. The IT2 is the current at or before the MOS gets into secondary breakdown (thermal/permanent damages) The higher the It2, the more robust the NMOS and the higher the ESD threshold. For the process technology where the suicide block and abrupt junction steps were are not available, a biasing network was necessary to ensure uniform triggering of all fingers. So, the need for high voltage tolerant I/O's severely complicates ESD protection.

FIG. 5A shows a single poly N-MOS device that is used in the prior art as an ESD device. The structure and snap back mechanism are described below. The single-poly N-MOS device is shown in cross section and layout in FIG. 5A. FIG. 5B shows a top plan view. FIG. 5C shows the IV curve and snap back curve for the ESD device. Vsp is the snapback holding voltage. FIG. 5D shows the electrical schematic of the device in FIG. 5A. When a short-duration (100 to 110 ns) constant current pulse is applied to the drain with the source and gate tied to the substrate (substrate grounded), the device should have the I–V characteristic shown in FIG. 5C. At normal operation, the device is off because the gate is grounded. When the drain breakdown voltage, BVdss is reached, current starts to flow as a result of impact ionization of die reverse-biased drain junction. At current It1, and voltage Vt1, the device triggers into snapback. The trigger current It1 and voltage is related to the channel length and BVdss. Note that the trigger point (Vt1, It1,) is not the same as BVdss. BVdss, usually is defined as the drain junction avalanche breakdown voltage at a specified drain current density. The trigger point is the point that has the highest voltage just before snapback. The snapback region of the I–V curve is roughly linear and, therefore, may be represented by a snapback voltage Vsb and a differential resistance Rsb. The snapback voltage Vsb is defined as the linear extrapolation of the snapback region back to zero current. Care must be taken to avoid defining Vb and Rb by extrapolating from low current values near the point where the I–V curve changes slope from negative to positive. Therefore, the values of Vsb and Rsb were obtained from measurements made at high currents with the transmission-line pulse technique. Because the high-current values are relevant to ESD events, we need to use them rather than the low-current values when designing for protection against ESD. With sufficiently high current It2, flowing in the snapback region, the device triggers into second breakdown. We define a second trigger point (Vt2, It2) corresponding to the triggering from snapback into second breakdown. Second breakdown is the term used for power bipolar devices to indicate the regime of thermal runaway and current-instability.

The importance of overcoming the various deficiencies noted above is evidenced by the extensive technological development directed to the subject, as documented by the relevant patent and technical literature. The closest and apparently more relevant technical developments in the patent literature can be gleaned by considering: U.S. Pat. No. 5,898,205 (Lee), U.S. Pat. Nos. 5,519,242 (Avery), U.S. Pat. No. 5,969,923 (Avery), U.S. Pat. No. 5,559,352 (Hsue et al.), U.S. Pat. No. 5,043,782 (Avery) and U.S. Pat. No. 5,689,113 (Li et al.).

SUMMARY OF THE INVENTION

It is an object of the present invention to provide a structure and a method for fabricating an Electro Static Discharge (ESD) device using a NMOS transistor structure there the collector of the parasitic bipolar Transistor has high resistivity regions that increase the resistivity of the collector.

To accomplish the above objectives, the present invention provides a structure and a method for an ESD device. The invention is an ESD device (e.g., parasitic bipolar transistor) that has the structure of a N-MOS transistor and a p+ substrate contact. The source and drain of the MOS transistor form the collector and base of the ESD's parasitic bipolar transistor. The device preferably has silicide regions over the doped regions. The ESD device is a parasitic bipolar NPN Tx. The invention has high resistivity regions within the collector of the parasitic NPN (e.g., drain of the FET). The invention has two embodiments (preferred types) of high resistivity regions: 1) isolation regions (e.g., oxide shallow trench isolation (STI)) and 2) high resistance (e.g., lightly doped regions or undoped, (e.g., channel regions)). The channel regions can have gates thereover and the gates can be charged. Also, optionally a n⁻ well (n minus well) can be formed under the collector/drain. The high resistivity regions increase the collector resistivity thereby improving the performance of the ESD device.

The invention's Electro Static Discharge (ESD) device preferably comprises:
- a first doped region and a second doped region in a substrate; the first and second doped regions have a first conductivity type dopant;
- at least a high resistivity region at least partially surrounded at the substrate surface, by the first doped region;
- a first gate over a first channel region; the first channel region between the first and the second doped regions;
- a third doped region separated from the second doped region by an isolation region; the third doped region has a second conductivity type dopant.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 5A shows a single poly N-MOS device that is used in the prior art as an ESD device.

FIG. 5B shows a top plan view of the single poly N-MOS device shown in FIG 5A according to the prior art.

FIG. 5C shows the IV curve and snap back curve for the ESD device according to the prior art.

FIG. 5D shows the electrical schematic of the device in FIG. 5A according to the prior art.

DETAILED DESCRIPTION OF THE PREFERRED EMBODIMENTS

A. Invention's ESD Device with High Resistivity Collector

The invention is a structure for a ESD device that has the structure of a N-MOS transistor and a p+ substrate contact. The device preferably has suicide regions over the doped regions. The ESD device is a parasitic bipolar NPN Tx. The invention has high resistivity regions within the collector of the parasitic NPN. The invention has two preferred types of high resistivity regions: 1) isolation regions (e.g., oxide shallow trench isolation (STI)) and 2) undoped regions (e.g., channel regions). Other high resistivity regions can be used such as low doped or oppositely conductivity regions or other semiconductors or insulators that have a higher resistivity that the n+ region, well, or the substrate. In the second preferred embodiment, the channel regions can have gates thereover; the gates can be charged orbiased. Also, optionally a N⁻ well (n minus well) can be formed under the collector. The high resistivity regions increase the collector resistivity thereby improving the performance of the ESD device. Resistance at drain side provide additional balasting resistor (e.g., Rdw) which can help the uniformity and prevent pre-mature triggering. A key point of the invention is the use of the high resistance regions to increase the resistance at the drain region. This contrasts with use of salicide blocks and n-well resistance. It is an important point that the invention can be implemented with suicide on the ESD device. It is common to remove the silicide for ESD devices.

Figure 1A:
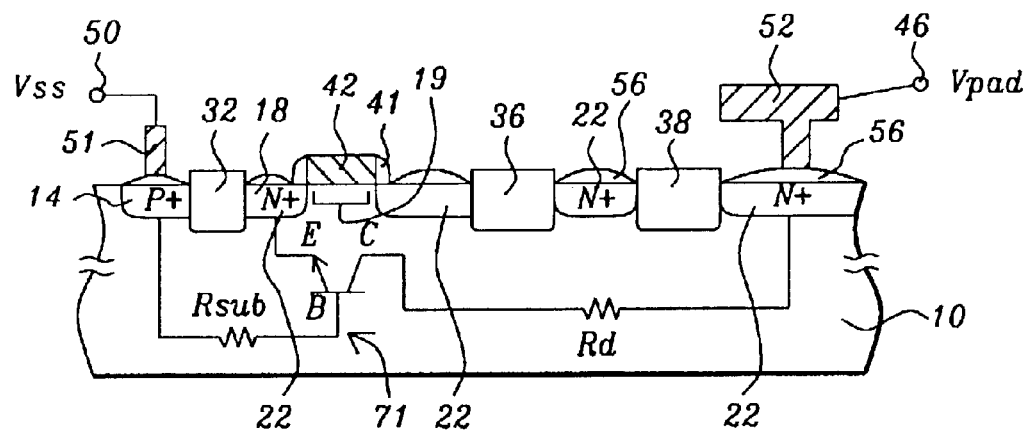
FIG. 1A is a cross sectional view for illustrating a first embodiment of the ESD device according to the present invention.
Figure 1B:
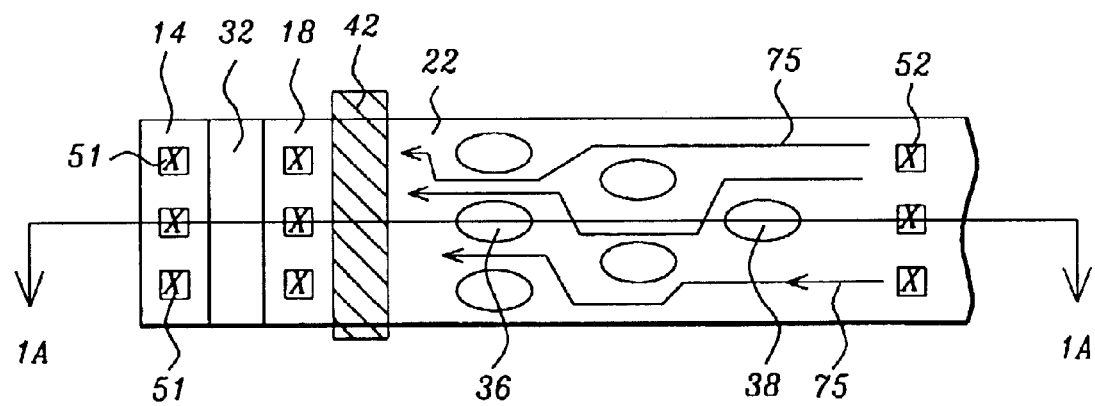
FIG. 1B is a top down view for illustrating a first embodiment of the ESD device according to the present invention.

The arrows 75 in FIG. 1B illustrate the current path in the first doped region 22. The high resistivity regions (e.g., 36 38) impede the current flow and reduce the cross sectional area of doped region 22, thus increasing the resistance.

The ESD device can be described as follows. As shown in FIG. 1A, a first n+ region 22 and a second n+ region 18 are in a substrate 10. The substrate 10 preferably is p-doped. The substrate 10 can represent a wafer or a well in a wafer.

High resistivity regions (e.g., 36, 38 (FIGS. 1A, 2A,) 61, 65 (FIGS. 3A, 4A)) are at least partially surrounded on at least one side by the first n+ region 22. That is, the high resistivity regions reduce the cross sectional area of the first n+ region 22 thereby increasing the resistivity of the first n+ region 22. The high resistivity regions do not have to extend all the way thru the high resistivity regions. Also, the high resistivity regions do not have to be totally surrounded by the first n+ region 22. For example the high resistivity region can be adjacent (e.g., border) to isolation regions.

A first gate 42 is over a first channel region 19. The first channel region 19 between the first and the second n+ regions 22 18.

A first p+ region (substrate contact, base of parasitic bipolar contact) 14 is separated from the second n+ region 18 by an isolation region.

A drain contact 52 is preferably spaced from the first gate by at least a first isolation region 38 36. The drain contact 52 contacts the first n+ region 22.

The parasitic bipolar transistor (tx) 71 comprises: a collector 22, base 10 (substrate or well), emitter 18. The p+ region 14 is the base/substrate contact.

In addition, the doping types of the doped regions can be reversed. That is the N regions can be p-type and the P regions can be n-type. For example, the substrate can be doped n type, the first n+ regions and second region are p doped and the first p+ region is n-doped.

B. First Embodiment—STI Regions 36 38 Increase the Resistance of the First n+ Region 22

In a first embodiment of the invention, as shown in FIG. 1A, the high resistivity regions are comprised of spaced isolation regions 36 38. The spaced isolation regions 36 38 is in the first n+ region 22. The spaced isolation regions 36 38 increase the resistance of the first n+ region 22. In FIG. 1A, Rd is the resistance of the drain that the invention's spaced isolation regions increase. The isolation regions force the current to go around or under, thus increasing the resistance. FIG. 1A shows the electrical schematic of the ESD parasitic bipolar Tx. C is the collector. B is the base. E is the emitter.

The spaced isolation regions can be any type of isolation region, such as field oxide regions, LOCOS, shallow trench isolation (STI) etc. and can be formed of any insulating material, e.g., oxide, silicon oxynitride, nitride, etc. or high resistivity material.

Figure 2A:
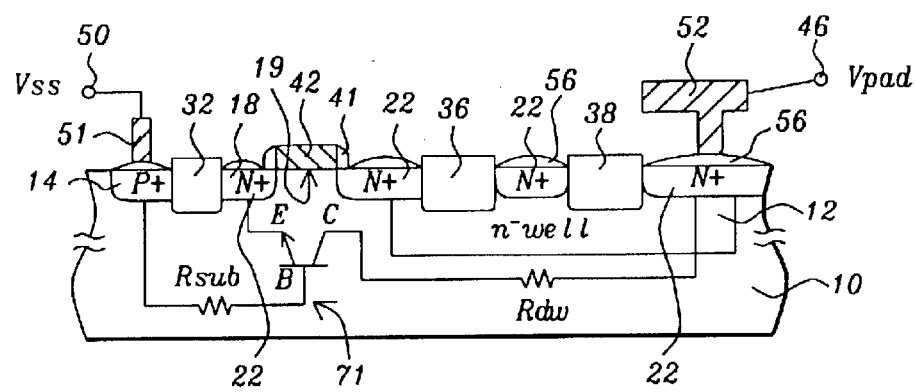
FIG. 2A is a cross sectional view for illustrating a first embodiment of the ESD device with an optional n-well 12 according to the present invention.

As shown in FIG. 2A, the high resistivity regions comprise spaced isolation regions 36. Spaced isolation regions 36 38 are surrounded at least on the sides the first n+ region 22 whereby the spaced isolation regions 36 38 increase the resistance of the first n+ region 22.

As shown in FIG. 2A, an optional n-well (n minus well—e.g., lightly doped well) 12 is under the first n+ region 22, the spaced isolation regions 36 38 and under a portion of the second n+ region 18. FIG. 2A shows the electrical schematic of the ESD parasitic bipolar Tx. The Rdw is the resistance of the collector of the Tx. The isolation regions 36 38 increase the resistance of the collector (or N-well).

1. Method for the First Embodiment

The method for the $1^{st}$ embodiment is described below. Referring to FIGS. 1A and 1B, we form first isolation regions 36 38 and standard isolation regions 32 in a substrate 10. The first isolation regions 36 38 and standard isolation regions 32 can be formed in the same steps or in separate steps. The first isolation regions 36 38 are formed in an area where a first n+ region 22 will subsequently be formed. Alternately, the first isolation regions can be formed after the first n+ regions are formed. The first isolation regions can be shallow trench isolation (STI) regions or LOCOS regions. In conventional products, the isolations regions are used to separate the active areas. In contrast, the invention uses the isolation regions to provide extensive current path or charge carrier migration passage to increase the resistance. A key point of the invention is the increase of resistance at the drain side by using the first isolation regions.

Next we form a first gate 42 over a first channel region 19 in the substrate 10. The first channel region 19 is between the first and the second n+ regions 22 18. Spacers 41 can be formed on the gate.

First n+ region 22 and a second n+ region 18 are formed in a substrate 10. Isolation regions 36 38 are at least partially surrounded by the first n+ region 22. The doped regions are preferably formed by an implant process.

The first p+ region 14 is separated from the second n+ region 18 preferably by a standard isolation region 32. The standard isolation regions can be formed in other areas of the chip at the same time. The standard isolation regions can be formed using any isolation process, such as STI processes. The gates block the N and P doped regions from being formed in the channel regions under the gates.

We form silicide regions 56 on the first p+ region 14; the first n+ region 22 and the second n+ region 18. The suicide regions can also be formed on the gates. The silicide process can be a conventional suicide or salicide process. It is, important to note that the invention does not require a suicide mask/etch step and that the silicide can be a blanket deposition.

A drain contact 52 is formed separated from the first gate by preferably at least a first isolation region 38 36. The drain contact 52 contacting the first n+ region 22.

A Vss contact 51 is formed to the first p+ region 14 whereby the first n+ region 22. The substrate and the second n+ region 18 comprise a parasitic bipolar ESD transistor and the first isolation regions increase the resistance of the first n+ region.

2. The method for the optional N-well in the first embodiment 12

Figure 2B:
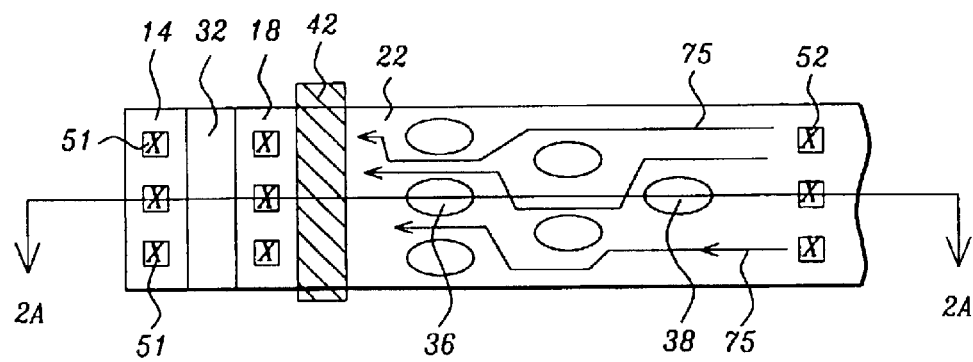
FIG. 2B is a top down view for illustrating a first embodiment of the ESD device with an optional n-well 12 according to the present invention.

As shown in FIGS. 2A and 2B, a n-well 12 is formed. As shown in FIGS. 2a and 2b isolation (e.g., STI) region(s) 36 38 are formed within a n-well 12. The n-wells are typically formed before the N and P diffusions. The spaced isolation regions 36 38 will subsequently be formed and in the area where a portion of the first n+ region 22 will be subsequently be formed.

Figure 3A:
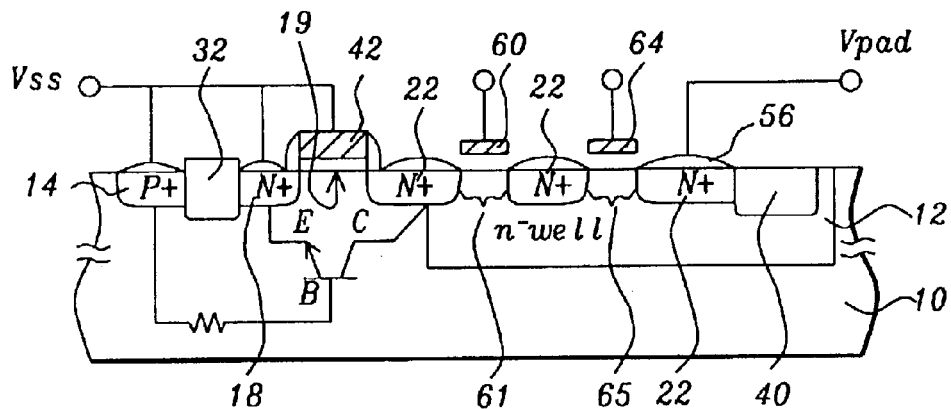
FIG. 3A is a cross sectional view for illustrating a second embodiment of the ESD device according to the present invention.
Figure 3B:
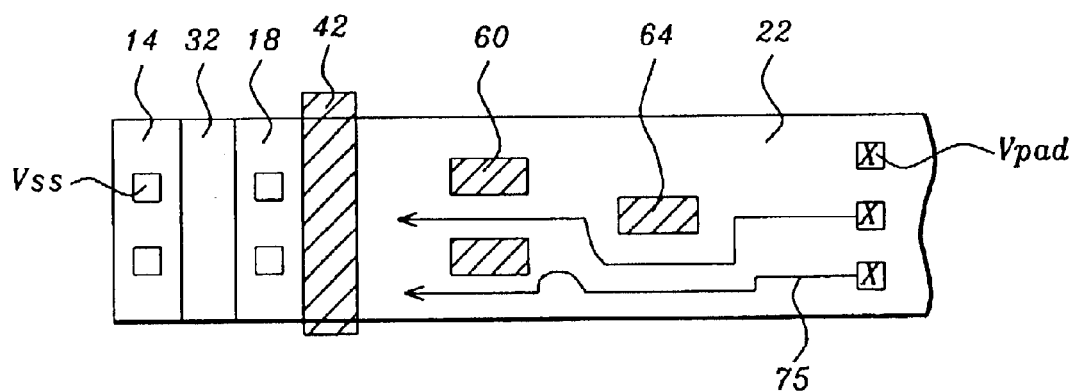
FIG. 3B is a top down view for illustrating a second embodiment of the ESD device according to the present invention.

C. Second Embodiment—High Resistivity Regions are Undoped or Lightly Doped Regions As shown in FIGS. 3A and 3B, in the second embodiment, the high resistivity regions comprise undoped or lightly doped regions (e.g., second channel regions 61 65). The high resistivity regions can be of either type conductivity (p or n). The second channel regions 61 65 are surrounded at least on the sides by the first n+ region 22. Spaced second gates 60 64 are over the second channel regions 61 65.

Also, optionally, a n-well 12 is under the first n+ region 22, the spaced isolation regions 36 38, second channel regions 61 65, and under a portion of the second n+ region 18.

1. The Method for the Second Embodiment

The method for the second embodiment is the similar to the method for the first embodiment unless stated otherwise. As shown in FIGS. 3A and 3B, in the second embodiment, the high resistivity regions comprise undoped or lightly doped regions (e.g., second channel regions 61 65). The high resistivity regions can be of either type conductivity (p or n). The second channel regions 61 65 are at least partially surrounded at least on the sides (e.g., at the substrate surface) by the first n+ region 22. Spaced second gates 60 64 are over the second channel regions 61 65.

The method for the second embodiment is described below. As shown in FIGS. 3A and 3B, we form standard isolation regions 32 40 in a substrate 10. The substrate 10 is preferably p-doped.

We form a first gate 42 over a first channel region 19 and form second gates 60 64. The second gates 60 64 are formed in an area where a first n+ region 22 will subsequently be formed. First channel regions are under the first gates. Second channel regions 61 65 under the second gates 60 64.

We form a first n+ region 22 and a second n+ region 18 in a substrate 10. The first n+ region 22 are not formed in the second channel regions 61 65. The second channel regions 61 65 are at least surrounded by the first n+ region 22. The first channel region 19 is between the first and the second n+ regions 22 18.

We form a first p+ region 14 separated from the second n+ region 18 by a standard isolation region 32. The p+ and n+ regions can be formed in any order.

We form silicide regions 56 on the first p+ region 14, the first n+ region 22 and the second n+ region 18. The silicide regions can be formed on the gates.

We form a drain contact 52 separated from the first gate by at least a first isolation region 38 36. The drain contact 52 contacts the first n+ region 22.

We also form a Vss (50) contact 51 to the first p+ region 14. The first n+ region 22, the substrate 10 and the second n+ region 18 comprise a parasitic bipolar ESD transistor and the second channel regions 62 65 increase the resistance of the first n+ region.

2. First Option for Second Embodiment—N-Well Under Collector

Optionally, a n-well (n minus well) 12 is under the first n+ region 22, the spaced isolation regions 36 38, second channel regions 61 65, and under a portion of the second n+ region 18. (For example, see FIG. 3A (n-well) 12).

3. Second Option for Second Embodiment—Second Gates Electrically Connected

Figure 4A:
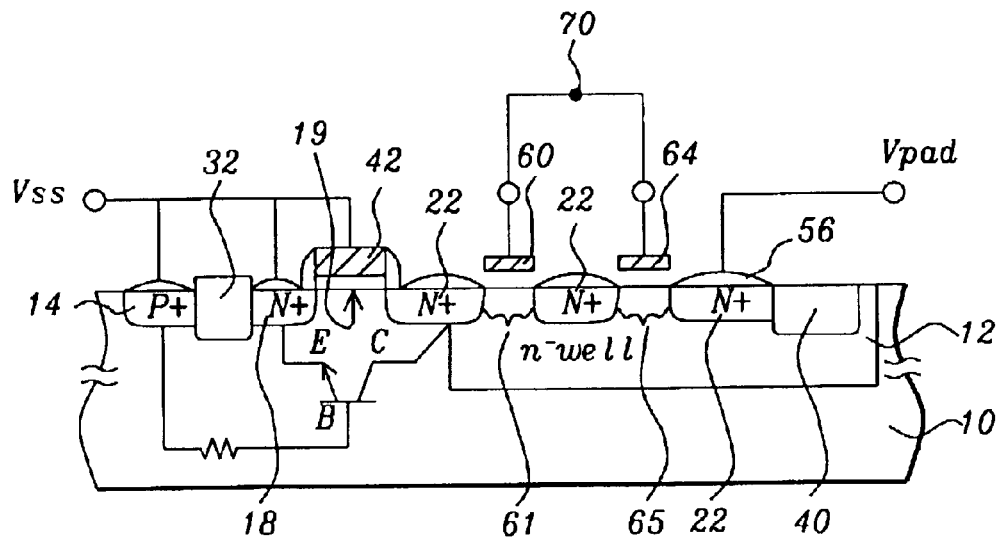
FIG. 4A is a cross sectional view for illustrating an option for the second embodiment of the ESD device where the gates are connected and optionally charged according to the present invention.

In an option for the second embodiment, as shown in FIG. 4A, the high resistivity regions also comprise at least one second channel region(s) 61 65. The second channel regions 61 65 at least partially surrounded by the first n+ region 22. That is, the second channel regions are in a portion of the first n+ region. Spaced second gates 60 64 are over the second channel regions 61 65.

The second gates are preferably electrically connected 70 to each other.

The second gates are electrically connected 70 to each other and can be optionally charged. The charged gates 66 64 can create electric fields within the doped region 22 and thereby change the resistivity for the region 22. The resistivity can be either increased or decreased.

Figure 4B:
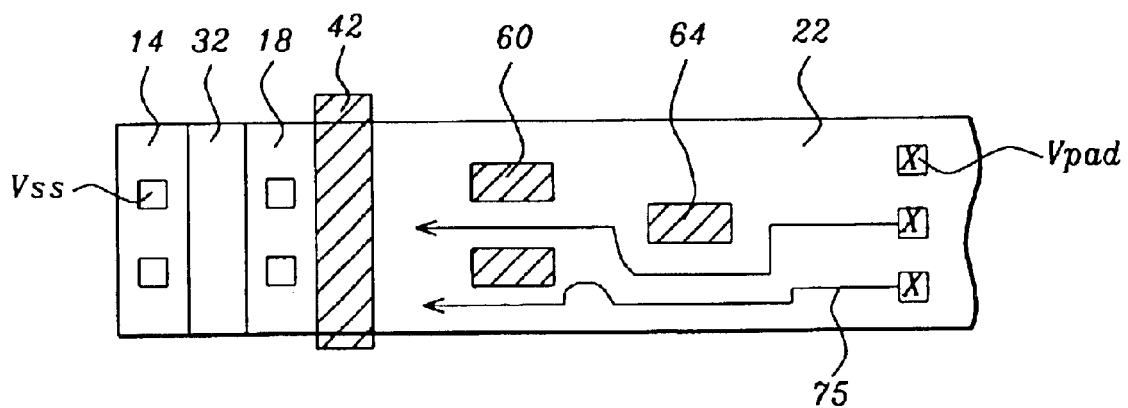
FIG. 4B is a top down view for illustrating an option for the second embodiment of the ESD device where the gates are connected and optionally charged according to the present invention.

Optionally, a n-well (n minus well) 12 is under the first n+ region 22, the spaced isolation regions 36 38, second channel regions 61 65, and under a portion of the second n+ region 18. (For example, see FIG. 3A (n-well) 12).

a) Method for the Second Option for the Second Embodiment—Connected Second Gates The method for the option for the second embodiment is describe below. As shown in FIGS. 4A and 4B, we form standard isolation regions 32 40 in a substrate 10. The substrate 10 is p-doped.

We form a first gate 42 over a first channel region 19 and form second gates 60 64. The second gates 60 64 are formed in an area where a first n+ region 22 will subsequently be formed. First channel regions are under the first gates. Second channel regions 61 65 are under the second gates 60 64.

We form a first n+ region 22 and a second n+ region 18 in a substrate 10. The first n+ region 22 are not formed in the second channel regions 61 65. The second channel regions 61 65 are preferably partially surrounded by the first n+ region 22. The first channel region 19 is between the first and the second n+ regions 22 18.

We form a first p+ region 14 separated from the second n+ region 18 by a standard isolation region 32. The p+ and n+ regions can be formed in any order.

We form silicide regions 56 on the first p+ region 14, the first n+ region 22 and the second n+ region 18. The silicide regions can be formed on the gates.

We form a drain contact separated from the first gate by at least a first isolation region 38 36. The drain contact contacts the first n+ region 22.

We also form a Vss contact to the first p+ region 14. The first n+ region 22, the substrate 10 and the second n+ region 18 comprise a parasitic bipolar ESD transistor and the second channel regions 62 65 increase the resistance of the first n+ region.

As shown in FIGS. 4A and 4B, The second gates can be electrically connected by polysilicon or metal conductive line 70 over the substrate.

The first option (n-well) can be combined with the second option charged second gates) for the second embodiment.

4. Third Option—Second Gates Charged

In a third option, the second gate(s) can be charged. The charge on the gate can increase or reduce the resistance of the doped region 12 22. That is connection 70 can be connected to a constant voltage source or to the Vpad. Biasing the gate to make the channel partially or fully open is the way to change the channel resistance, resulting in a change in the total collector resistance. For example the gate can be charged from −Vdd to positive +Vdd or any value in-between.

The third option can be implemented in combination with the first option

Unless explicitly stated otherwise, in the specification and claims, each numerical value and range should be interpreted as being approximate as if the word about or approximately preceded the value of the value or range.

Note that the terms n+ and n−, p+ and p− do not limit the concentrations of the regions. Also opposite type impurities can be used. For example the n doped regions can be p doped regions, etc.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. An electro static discharge (ESD) device; comprising:
   a) a first n+ region and a second n+ region in a substrate; said substrate has a surface;
   b) at least one high resistivity region surrounded on the surface of the substrate by said first n+ region; and
   c) a first gate over a first channel region; said first channel region between said first and said second n+ regions.

2. An electro static discharge (ESD) device; comprising:
   a) a first n+ region and a second n+ region in a substrate; said substrate has a surface;
   b) at least one high resistivity region at least partially surrounded on the surface of the substrate by said first n+ region; and
   c) a first gate over a first channel region; said first channel region between said first and said second n+ regions.

3. The electro static discharge device of claim 2 which further includes suicide regions on said first p+ region.

4. The electro static discharge device of claim 2 which further includes suicide regions on said first p+ region and on said first n+ region and said second n+ region.

5. The electro static discharge device of claim 2 wherein said high resistivity regions comprise spaced isolation regions; said spaced isolation regions in said first n+ region whereby said spaced isolation regions increase the resistance of said first n+ region.

6. The electro static discharge device of claim 2 wherein said high resistivity regions comprise spaced isolation regions; spaced isolation regions surrounded on the surface of said substrate by said first n+ region whereby said spaced isolation regions increase the resistance of said first n+ region; a n-well under said first n+ region, and under portions of said spaced isolation regions.

7. The electro static discharge device of claim 2 Wherein said high resistivity regions comprise second channel regions; second channel regions reduce the cross sectional area of said first n+ region; spaced second gates over said second channel regions.

8. The electro static discharge device of claim 2 wherein said high resistivity regions comprise second channel regions; said second channel regions reduce the cross sectional area of said first n+ region; spaced second gates over said second channel regions; a n-well under said first n+ region, said spaced isolation regions, and said second channel regions.

9. The electro static discharge device of claim 2 wherein said high resistivity regions comprise second channel regions; said second channel regions reduce the cross sectional area of said first n+ region; spaced second gates over said second channel regions.

10. The electro static discharge device of claim 2 wherein said high resistivity regions comprise second channel regions; said second channel regions reduce the cross sectional area of said first n+ region; spaced second gates over said second channel regions; said second gates electrically connected to each other.

11. The electro static discharge device of claim 2 wherein said high resistivity regions comprise second channel regions; said second channel regions reduce the cross sectional area of said first n+ region; spaced second gates over said second channel regions; said second gates electrically connected to each other and the second gates are charged.

12. The electro static discharge device of claim 2 wherein said high resistivity regions comprise second channel regions; second channel regions surrounded by said first n+ region; spaced second gates over said second channel regions; said second gates electrically connected to each other; a n-well under said first n+ region, said spaced isolation regions, second channel regions, and under a portion of said second n+ region.

13. The electro static discharge device of claim 2 which further includes:
   a) a first p+ region separated from said second n+ region by a standard isolation region.
   b) a drain contact separated from said first gate by at least a first isolation region; and
   c) said drain contact contacting said first n+ region, and said first n+ region and said second n+ region.

14. The electro static discharge device of claim 2 wherein said substrate is a silicon substrate with a p type doping.

15. The electro static discharge device of claim 2 wherein the first n+ regions and second region are p doped and the first p+ region is n-doped.

16. The electro static discharge device of claim 2 which further includes silicide regions on said first p+ region.

17. The electro static discharge device of claim 2 which further includes silicide regions on said first p+ region and on said first n+ region and said second n+ region.

18. The electro static discharge device of claim 2 wherein said high resistivity regions comprise spaced isolation regions; said spaced isolation regions in said first n+ region whereby said spaced isolation regions increase the resistance of said first n+ region.

19. The electro static discharge device of claim 2 wherein said high resistivity regions comprise second channel regions; second channel regions reduce the cross sectional area of said first n+ region; spaced second gates over said second channel regions.

20. An electro static discharge device; comprising:
   a) a first n+ region and a second n+ region in a substrate; said substrate is p-doped;
   b) high resistivity regions at least partially surrounded by said first n+ region; said high resistivity regions comprise second channel regions; said second channel regions at least partially surrounded on the substrate surface by said first n+ region;
   c) spaced second gates over said second channel regions;
   d) a first gate over a first channel region; said first channel region between said first and said second n+ regions;
   e) a first p+ region separated from said second n+ region by a standard isolation region; and
   f) a drain contact contacting said first n+ region.

21. The Electro Static Discharge device of claim 20 wherein said second gates electrically connected to each other and the second gates are charged.

22. The Electro Static Discharge device of claim 20 which further include silicide regions on said first p+ region, said first and said second n+ regions.

23. The Electro Static Discharge device of claim 20 wherein said drain contact separated from said first gate by at least a first isolation region.

24. An electro static discharge device; comprising:
   a) a first n+ region and a second n+ region in a substrate; said substrate is p-doped;
   b) high resistivity regions surrounded by said first n+ region; said high resistivity regions comprise spaced isolation regions; said spaced isolation regions at least partially surrounded on the substrate surface by said first n+ region whereby said spaced isolation regions increase the resistance of said first n+ region by reducing the cross-section area of said first n+ region;
   c) a first gate over a first channel region; said first channel region between said first and said second n+ regions;
   d) a first p+ region separated from said second n+ region by a standard isolation region.

25. The electro static discharge device of claim 24 which further includes suicide regions on said first p+ region.

26. The electro static discharge device of claim 24 which further includes silicide regions on said first p+ region and on said first n+ region and said second n+ region.

27. The electro static discharge device of claim 24 which further includes a n-well under at least portions of said first n+ region, and said spaced isolation regions.

28. The electro static discharge device of claim 24 which further includes a drain contact contacting said first n+ region.

* * * * *